United States Patent
Wernet et al.

(10) Patent No.: US 11,543,279 B2
(45) Date of Patent: Jan. 3, 2023

(54) METHOD FOR PROCESS MONITORING

(71) Applicant: Endress+Hauser SE+Co. KG, Maulburg (DE)

(72) Inventors: Armin Wernet, Rheinfelden (DE); Kaj Uppenkamp, Wehr (DE); Florian Falger, Schopfheim (DE)

(73) Assignee: Endress+Hauser SE+Co. KG, Maulburg (DE)

( * ) Notice: Subject to any disclaimer, the term of this patent is extended or adjusted under 35 U.S.C. 154(b) by 428 days.

(21) Appl. No.: 16/615,487

(22) PCT Filed: Apr. 10, 2018

(86) PCT No.: PCT/EP2018/059126
§ 371 (c)(1),
(2) Date: Nov. 21, 2019

(87) PCT Pub. No.: WO2018/215129
PCT Pub. Date: Nov. 29, 2018

(65) Prior Publication Data
US 2020/0158554 A1  May 21, 2020

(30) Foreign Application Priority Data
May 24, 2017 (DE) .................... 10 2017 111 393.2

(51) Int. Cl.
*G01F 23/26* (2022.01)
*G01R 27/26* (2006.01)
(Continued)

(52) U.S. Cl.
CPC ............ *G01F 23/26* (2013.01); *G01F 23/802* (2022.01); *G01R 27/2617* (2013.01)

(58) Field of Classification Search
CPC ........ G01R 27/00; G01R 27/02; G01R 27/26; G01R 27/2605; G01R 27/2617;
(Continued)

(56) References Cited

U.S. PATENT DOCUMENTS 5,220,514 A * 6/1993 John ..................... G01F 23/243
324/705
5,304,002 A    4/1994 Shervin
(Continued)

FOREIGN PATENT DOCUMENTS

CN   101233391 A   7/2008
CN   102859336 A   1/2013
(Continued)

*Primary Examiner* — Hoai-An D. Nguyen
(74) *Attorney, Agent, or Firm* — Kelly J. Smith; Endress+Hauser (USA) Holding Inc.

(57) ABSTRACT

Provided is a method for process monitoring in automation technology based at least on one capacitive and/or conductive measuring probe for determining at least one process variable of at least one medium in a container, an apparatus suitable for executing the method, as well as a computer program and a computer readable medium. The method includes method steps of ascertaining whether the measuring probe is at least partially in contact with the medium and registering as a function of time at least an electrical conductivity of the medium, a dielectric constant of the medium and/or a degree of coverage of the measuring probe by the medium. The method also includes a step of monitoring the process running within the container based on the electrical conductivity, the dielectric constant and/or the degree of coverage as a function of time.

13 Claims, 3 Drawing Sheets

(51) Int. Cl.
*G01F 23/00* (2022.01)
*G01F 23/80* (2022.01)

(58) Field of Classification Search
CPC .......... G01F 23/00; G01F 23/22; G01F 23/24; G01F 23/26; G01F 23/261; G01F 23/263; G01F 23/80; G01F 23/802; G01F 23/0069
USPC ....... 324/600, 649, 658, 661, 662, 663, 671, 324/686, 690, 691, 693, 699; 702/1, 33, 702/50, 55
See application file for complete search history.

(56) References Cited

U.S. PATENT DOCUMENTS

| | | | |
|---|---|---|---|
| 2005/0062611 A1* | 3/2005 | Johnson | E03C 1/24 340/616 |
| 2010/0180679 A1 | 7/2010 | Luo | |
| 2012/0111870 A1 | 5/2012 | Hodgson et al. | |

FOREIGN PATENT DOCUMENTS

| | | |
|---|---|---|
| CN | 103194803 A | 7/2013 |
| CN | 103968916 A | 8/2014 |
| CN | 105026899 A | 11/2015 |
| DE | 3212434 C2 | 10/1983 |
| DE | 102005042646 A1 | 3/2007 |
| DE | 102006047780 A1 | 4/2008 |
| DE | 102007061574 A1 | 6/2009 |
| DE | 102008043412 A1 | 5/2010 |
| DE | 102009030674 A1 | 12/2010 |
| DE | 102010055781 A1 | 6/2012 |
| DE | 102011004807 A1 | 8/2012 |
| DE | 102013102055 A1 | 9/2014 |
| DE | 102013104781 A1 | 11/2014 |
| DE | 102013111188 A1 | 4/2015 |
| DE | 102014107927 A1 | 12/2015 |
| EP | 0349528 A1 | 1/1990 |
| EP | 1066500 A1 | 1/2001 |
| EP | 1067368 A1 | 1/2001 |
| EP | 1882914 A2 | 1/2008 |
| EP | 3115757 A1 | 1/2017 |
| JP | 11120910 A | 4/1999 |
| TW | I249571 B | 2/2006 |
| WO | 2009081194 A1 | 7/2009 |
| WO | 2011136729 A1 | 11/2011 |
| WO | 2014131639 A1 | 9/2014 |
| WO | 2014145971 A2 | 9/2014 |

\* cited by examiner

METHOD FOR PROCESS MONITORING

CROSS-REFERENCE TO RELATED APPLICATIONS

The present application is related to and claims the priority benefit of German Patent Application No. 10 2017 111 393.2, filed on May 24, 2017 and International Patent Application No. PCT/EP2018/059126, filed on Apr. 10, 2018, the entire contents of which are incorporated herein by reference.

TECHNICAL FIELD

The invention relates to a method for process monitoring in automation technology based on a capacitive and/or conductive measuring probe, a corresponding apparatus, a computer program and a computer readable medium.

BACKGROUND

A capacitive and/or conductive measuring probe is used in automation technology in many cases for monitoring a fill level. When the well known, conductive measuring method is used for this purpose, it is monitored, for example, whether via the conductive medium an electrical contact between a probe electrode and the wall of a conductive container or a second electrode is present. Corresponding field devices are sold by the applicant, for example, under the mark, Liquipoint.

In the case of media with lower electrical conductivity (<1 µS/cm), for example, distilled water, molasses or alcohols, or even in the case of media with an electrical conductivity of less than 1 µS/cm and a dielectric constant of less than 20, for example, oils and fats, however, a change of the conductivity of the medium relative to the conductivity of air is too small still to be able to be registered safely by the electronics of a typical conductive fill level measuring device. In these cases, usually the likewise well known capacitive measuring method is used, where the fill level of medium is ascertained from the capacitance of the capacitor formed by a probe electrode and the wall of the container or a second electrode. Depending on the conductivity of the medium, in such case, either the medium or a probe insulation forms the dielectric of the capacitor. Field devices using the capacitive measuring principle are sold by the applicant in many different embodiments, for example, under the marks, Liquicap and Solicap.

Fill level detection by means of a capacitive measuring method is, indeed, possible, in principle, for conductive and non-conductive media. However, for media with increased conductivity, preferably an insulation of the measurement probe is necessary, since the medium otherwise effects a short circuiting of the measurement circuit. The impedance of this insulation, especially that of the guard electrode to be described below, is, however, disadvantageous for clinging media, since the impedance then contains a supplemental, series connected impedance for the medium.

Known from DE 32 12 434 C2 for preventing accretion formation is the use of a guard electrode, which coaxially surrounds the sensor electrode and lies at the same electrical potential as the sensor electrode. Depending on character of the accretion, there is in the case of this embodiment the problem of suitably producing the guard signal. Expanding on this, DE 10 2006 047 780 A1 discloses a measurement probe with an amplifying unit and a limiting element, in order to be insensitive to accretion formation over a large measuring range. Additionally, DE 10 2008 043 412 A1 discloses a fill level measuring device with a memory unit, in which limit values for various media are stored. In the case of ex- or subceeding such a limit value, a switching signal is produced in such a manner that accretion formation does not influence reliable switching.

In order to be able to register a process variable, especially a predetermined fill level, of a medium with a single measuring device independently of the electrical properties of the medium, known from DE102011004807A1 is a probe unit with an at least sectionally coaxial construction for an apparatus for capacitive or conductive determining of at least one process variable of a medium in a container. This probe unit can be applied essentially flushly in a container, this being especially advantageous relative to hygienic standards, which must be maintained for certain applications.

A multisensor of such type is also subject matter of DE102013102055A1, which describes a method and an apparatus, by means of which a predetermined fill level can be determined alternately in a conductive and in a capacitive operating mode. In order further to be able to achieve an improved measuring resolution, known from DE102014107927A1 is to supply a measurement probe with an excitation signal composed of two periodic signal portions, wherein a first signal component is generated for a capacitive operating mode and a second signal component is generated for a conductive operating mode.

Disclosed in DE102013104781A1, finally, are a method and an apparatus, which permit the monitoring of at least one medium specific property of a medium in a capacitive and conductive operating mode. In such case, the medium specific property can be the electrical conductivity of the medium, or even a dielectric property of the medium, such as, for example, its dielectric constant.

SUMMARY

Starting from the state of the art, an object of the present invention is to expand the field of use of a capacitive and/or conductive measuring probe.

This object is achieved by the method as defined in claim 1, by the apparatus as defined in claim 11, the computer program as defined in claim 14 as well as by the computer readable medium as defined in claim 15.

Regarding the method, the object of the invention is achieved by a method for process monitoring in automation technology based at least on one capacitive and/or conductive measuring probe for determining at least one process variable of at least one medium in a container. The method includes method steps as follows:

ascertaining whether the measurement probe is at least partially in contact with the medium, registering as a function of time at least an electrical conductivity of the medium, a dielectric constant of the medium and/or a degree of coverage of the measurement probe by the medium, and monitoring at least one, or the, process running within the container based on the electrical conductivity, the dielectric constant and/or the degree of coverage as a function of time.

Advantageously, a process transpiring within the container can be monitored based on the electrical conductivity, the dielectric constant and/or the degree of coverage as a function of time. The present invention enables thus a comprehensive process monitoring via the ascertaining of a value of a relevant process variable.

In an embodiment of the method, the electrical conductivity, the dielectric constant and/or the degree of coverage are ascertained in a conductive operating mode and/or in a capacitive operating mode of the measurement probe. Depending on conductivity and/or dielectric constant of the medium, either the capacitive or the conductive operating mode can be more suitable. In this regard, reference is made especially to DE102013104781A1 (US2016116322), whose disclosure is herewith incorporated by reference.

In an additional embodiment of the method, at least one process parameter, especially temperature or pressure, of the at least one medium in the container is ascertained and taken into consideration for monitoring the process.

An advantageous embodiment includes ascertaining whether a predeterminable fill level of medium is present in the container. Process monitoring, in this case, is executed, for example, when the predeterminable fill level has been reached. The predeterminable fill level is, for example, a fill level corresponding to a predeterminable covering of the measuring probe by the medium, preferably a complete covering of the measuring probe by the medium. In an alternative embodiment of the method, it is ascertained, whether the measuring probe is at least partially, preferably completely, covered by a thin film of the at least one medium. It is, thus, for example, ascertained, whether a residue of the medium is present in the region of the measuring probe.

An especially preferred embodiment of the method provides that a mixing of at least a first medium and a second medium is monitored in the container. Thus, a mixing of at least a first and a second medium is monitored. In such case, it can, for example, be monitored, whether the at least two media have been mixed essentially to homogeneity.

Another especially preferred embodiment of the method provides that a cleaning process taking place in the container is monitored. In this regard, advantageously based on a change of the electrical conductivity, the dielectric constant and/or the degree of coverage, it is detected, how far the cleaning process has progressed. Likewise advantageously based on the electrical conductivity, the dielectric constant and/or the degree of coverage, residues of the at least one medium remaining in the container after termination of the cleaning process are detected.

In an additional preferred embodiment of the method, the presence of a predeterminable proportion of at least the first and the second medium in the container is monitored.

In another preferred embodiment, in turn, a keeping to a recipe is monitored for a process.

The object of the invention is achieved, moreover, by an apparatus for process monitoring in automation technology, comprising a capacitive and/or conductive measuring probe and an electronics unit, which is embodied to execute at least one embodiment of the method of the invention.

The apparatus is embodied, for example, corresponding to DE102011004807A1 and includes a measuring probe with at least sectionally coaxial construction. This probe unit can be embodied, for example, in such a manner that it can be inserted essentially flushly in a container. Besides DE102011004807A1 reference is likewise made in this regard to DE102014107927A1. Reference is made therewith to both documents.

Regarding the apparatus, such advantageously further comprises an, especially digital, interface for transmission of ascertained measured values of at least the electrical conductivity, the dielectric constant and/or the degree of coverage to an external unit.

Likewise advantageously, the apparatus further comprises a display unit for display of at least the electrical conductivity, the dielectric constant and/or the degree of coverage as a function of time, and/or for display of information concerning the process running within the container.

Furthermore, the object of the invention is achieved by a computer program, comprising commands, which, upon execution of the program by a computer, cause the computer to perform at least one embodiment of the method of the invention. Finally the object of the invention is likewise achieved by a computer readable medium, comprising commands, which upon execution by a computer, cause the computer to perform at least one embodiment of the method of the invention.

It is to be noted here that the embodiments described for the method of the invention can be applied mutatis mutandis also for the apparatus, the computer program and the computer readable medium of the invention, and vice versa.

BRIEF DESCRIPTION OF THE DRAWINGS

The invention will now be explained in greater detail based on the appended drawing, the figures of which show as follows.

DETAILED DESCRIPTION

Figure 1:
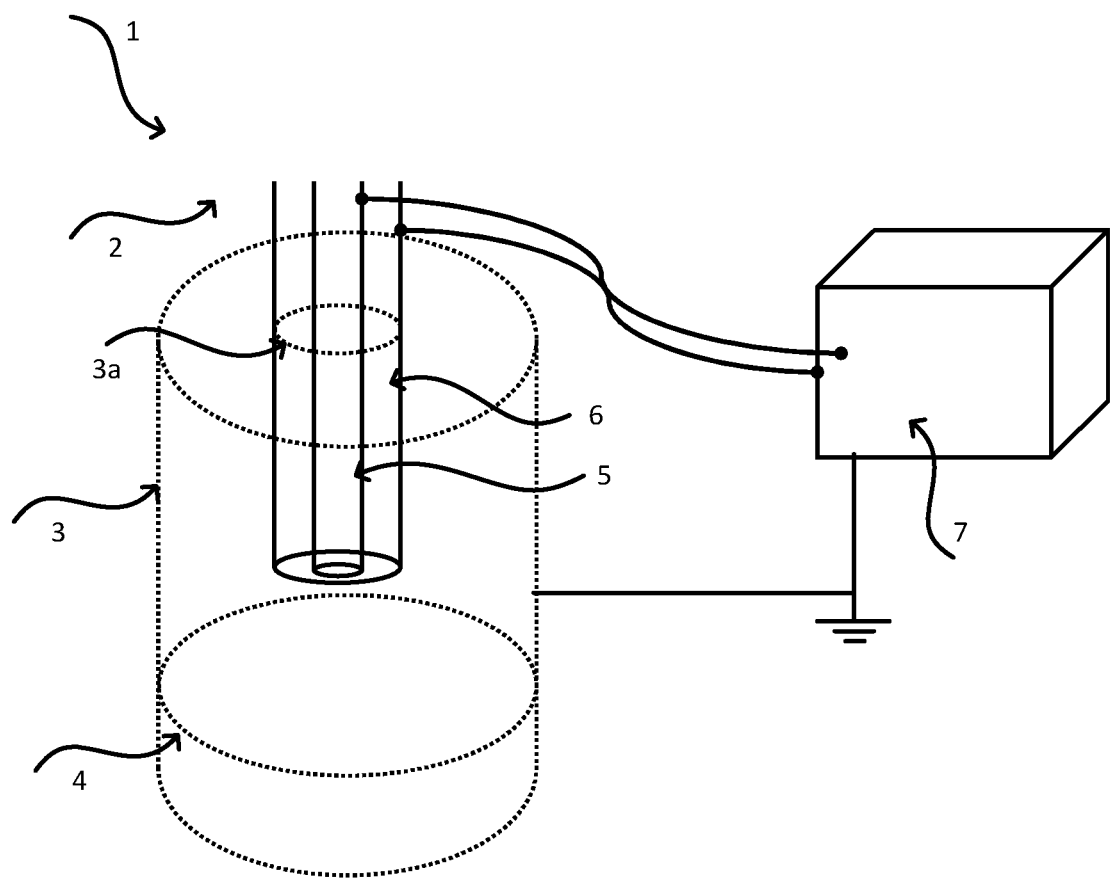
FIG. 1 shows a schematic view of a capacitive and/or conductive measuring probe according to state of the art.

FIG. 1 shows a prior art measuring device 1, by means of which a process variable, such as, for example, a fill level or a predetermined fill level, can be determined and/or monitored using the capacitive and/or conductive measuring method. A measuring probe 2 extends into a container 3, which is at least partially filled with a medium 4. Here, the measuring probe 2 extends into a container 3 via an opening 3a in the top of the container 3. In the example shown in FIG. 1, the measuring probe 2 protrudes from above into the container 3. Alternatively, the measuring probe 2 can also be mounted in a side wall of the container 3. In this case, also a flush mounting of the measuring probe is possible, such that the measuring probe terminates essentially flush with the inner surface of the container 3, this being especially advantageous in the case of tubes or containers with small inner diameters. Such a measuring probe is manufactured and sold by the applicant, for example, under the designation, FTW33.

The measuring probe 2 in the example shown here is composed of a sensor electrode 5 and a guard electrode 6. Both electrodes are electrically connected with an electronics unit 7, which is responsible for signal registration, —evaluation and/or —feeding. A ground electrode is provided in the example of FIG. 1 by the wall of the container 3. Container 3 is composed in the present case correspondingly of an electrically conductive material. Of course, a ground electrode can, alternatively, in the case of containers 3 with a wall of a non-conductive material, be embodied as an integral component of the measuring probe 2, or as another, separate electrode.

Electronics unit 7 determines and/or monitors in a measurement operation mode based on the response signals produced in the capacitive and conductive operating mode a process variable, such as, for example, whether a predetermined fill level of medium 4 in the container 3 is exceeded and/or subceeded, and generates, in given cases, upon the reaching of a predetermined fill level a corresponding report, or initiates a corresponding switching procedure. For this, the electronics unit 7 can be composed of two subunits for the two operating modes, such as, for example, described in DE102013104781A1, or in the form of a single electronics unit 7, which serves for the two operating modes, as provided, for example, in DE102014107927A1.

For process monitoring according to a method of the invention, it is first ascertained, whether the measuring probe 2 is at least partially in contact with the medium 4. For example, it can be checked whether the measuring probe 2 is essentially completely covered by the medium 4. Such is, for example, advantageous when a mixing of at least two different media 4 is monitored. Alternatively, it is likewise possible to test, whether the measuring probe 2 is at least partially covered by a thin film of the medium 4. Preferably, in this case, the measuring probe is covered at least to, for instance, 50% by the medium 4.

For executing the method of the invention, then at least an electrical conductivity of the at least one medium 4, a dielectric constant of the at least one medium 4 and/or a degree of coverage of the measuring probe 2 by the medium 4 is registered as a function of time and based on such data the process running within the container 3 is monitored.

Regarding the ascertaining of the electrical conductivity or the dielectric constant of the medium 4, reference is made to DE102014107927A1. The degree of coverage B is, in turn, defined as the ratio of a sensor electrical current tappable from the sensor electrode 5 and a guard electrical current tappable on the guard electrode 6.

Figure 2:
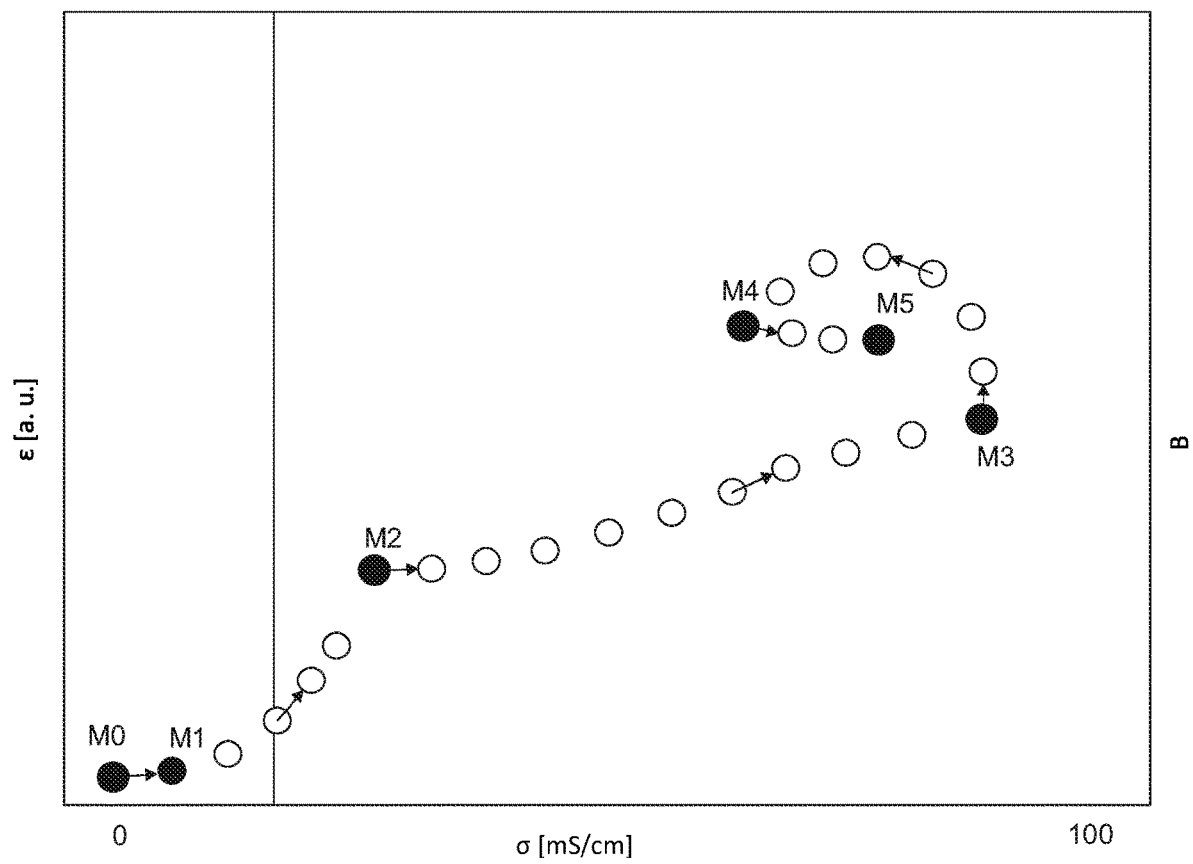
FIG. 2 shows a schematic diagram of monitoring the mixing of two media by means of an embodiment of the method of the present disclosure.

A first embodiment of the method of the invention is illustrated in FIG. 2. The process to be monitored is a mixing of a first 4a and a second medium 4b in a container 3. The diagram shows the degree of coverage B, the electrical conductivity $\sigma$, and the dielectric constant $\varepsilon$ as a function of time t. By means of a suitable display element [not shown], such a representation can be directly presented on the measurement device 1. The display unit can be, for example, a drag pointer, or a data logger. In such case, the measurement device 1 is directly embodied to perform at least one embodiment of the method of the invention. For example, the electronics unit 7 can comprise suitable means, such as, for example, a computing unit and/or a memory unit.

Alternatively, the measurement device 1 can also operate via an, especially digital, communication interface [not shown], for example, an I/O link interface. Both wired as well as also wireless interfaces provide options in this connection. For example, the method can be performed in an external unit [not shown], for example, a computer. For this, the method can be implemented, for example, in the form of a computer program. Alternatively, the method can also be implemented in a computer readable medium.

At the point in time M0, the measuring probe 2 is in air. At the point in time M1, a filling of the container 3 with a first medium 4a is started. At the point in time M2, a predeterminable fill level of the first medium 4a in the container 3 is achieved. The predeterminable fill level corresponds in the present example to an essentially complete covering of the measuring probe 2 with the first medium 4a. At the point in time M2, a second medium 4b is filled into the container and a mixing of the two media 4a and 4b started. As soon as, at the point in time M3, a complete and essentially homogeneous mixing of the two media 4a and 4b has been achieved, the measured values remain constant. In the example shown in FIG. 2, at the point in time M3, furthermore, a heating of the two mixed media 4a and 4b is started and the container 3 vacuumized. In the length of time between the points in time M3 and M4, the electrical conductivity $\sigma$ and the consistency of the media 4a and 4b change continuously in the container 3. At the point in time M4, a third medium 4c is added into the container 3 and a mixing procedure started anew within the container 3. Again, homogeneity of the mixing can be detected, for example, based on when the electrical conductivity $\sigma$ becomes constant. Such is the case in the present example at the point in time M5.

Figure 3:
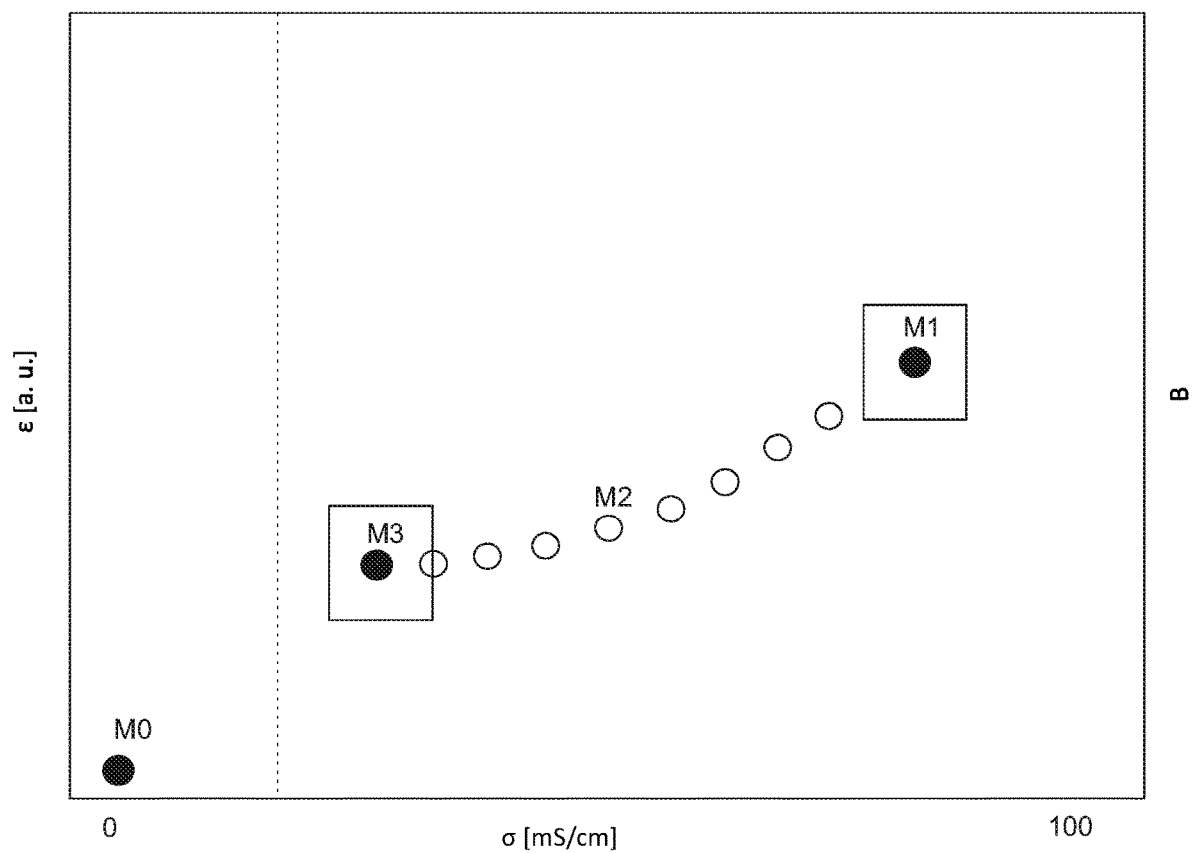
FIG. 3 shows a schematic diagram of monitoring a cleaning process in a container by means of an embodiment of the method of the present invention.

A second example of the method of the invention is shown in FIG. 3. In such case, a cleaning process is conducted in the container. For cleaning the container, usually the container 3 is filled at least partially with a suitable cleaning liquid. Usually, a cleaning process comprises a number of cycles, in each of which one or more cleaning liquids are introduced into the container 3. At the point in time M1, the cleaning process has not yet started. In the example shown here, the electrical conductivity $\sigma$ sinks in proportion with the progress of the cleaning. At the point in time M2, a second cycle of the cleaning process is started. As soon as it is detected at the point in time M3 that the electrical conductivity is essentially constant for a predeterminable duration, the cleaning process can be ended. Progress of the cleaning process can thus be monitored based on a change of the electrical conductivity $\sigma$, the dielectric constant $\varepsilon$ and/or the degree of coverage B. Likewise, it can be monitored based on at least one of these variables, whether, after termination of a cleaning cycle, residues of the medium 4 are still in the container 3. In such case, for example, the electrical conductivity $\sigma$ of the medium 4, or of the cleaning liquid 4, has not yet reached a plateau.

A cleaning process can be reliably monitored, in such case, both when the measuring probe 2 during the individual cycles is covered essentially completely by the cleaning liquid, which for monitoring of a cleaning process corresponds to the particular medium 4, which is present, as well as also when the measuring probe 2 is covered by a thin film of the cleaning liquid 4. This corresponds to a thin film of liquid sprayed on the measuring probe 2.

Based on the measured electrical conductivity $\sigma$, the dielectric constant $\varepsilon$ and/or the degree of coverage B as a function of time, thus, qualitative information concerning different processes in automation technology can be obtained. It is to be noted here that for process monitoring not, such as in the example shown in FIG. 2, necessarily the electrical conductivity $\sigma$, the dielectric constant $\varepsilon$ and the degree of coverage must be simultaneously considered as a function of time. Rather, it can for the desired process monitoring be likewise sufficient, when only one or two of the variables is/are measured. It is likewise to be noted here that besides the two examples of process monitoring also numerous other processes can be monitored, which all fall within the scope of the present invention. For example, the presence of a predeterminable proportion of at least a first 4a and a second medium 4b in the container 3, or even the keeping to a recipe can be monitored.

For example, reference values or reference curves can be recorded and stored for the electrical conductivity $\sigma$, the dielectric constant $\varepsilon$ and/or the degree of coverage B. These references values or reference curves correspond then to a correctly running process. In predeterminable time intervals, or during the execution of the process to be monitored, then correspondingly measured values or curves for the electrical conductivity σ, the dielectric constant ε and/or the degree of coverage B can be registered and compared with the reference values or reference curves. When a deviation between the measured values or curves and the associated reference values or reference curves exceeds a predeterminable limit value, then, for example, something wrong in the particular process can be assumed and, in given cases, a report generated and output.

The invention claimed is:

1. A method for process monitoring in automation technology based at least on one capacitive or conductive measuring probe for determining at least one process variable of at least one medium in a container, including steps of:
    ascertaining whether the measuring probe is at least partially in contact with the medium;
    registering as a function of time at least an electrical conductivity of the medium, a dielectric constant of the medium and a degree of coverage of the measuring probe by the medium; and
    monitoring a process running within the container based on the electrical conductivity, the dielectric constant and the degree of coverage as a function of time;
    wherein the presence of a predeterminable proportion of at least a first and a second medium in the container is monitored.

2. The method of claim 1, wherein the electrical conductivity, the dielectric constant or the degree of coverage are ascertained in a conductive operating mode or in a capacitive operating mode of the measuring probe.

3. The method of claim 1, wherein at least one process parameter of the at least one medium in the container is ascertained for monitoring the process.

4. The method of claim 1, wherein it is determined whether a predeterminable fill level of medium is present in the container or whether the measuring probe is at least partially covered by a thin film of the at least one medium.

5. The method of claim 1, wherein a mixing of at least the first medium and the second medium is monitored in the container.

6. The method of claim 1, wherein a cleaning process taking place in the container is monitored.

7. The method of claim 6, wherein, based on a change of the electrical conductivity, the dielectric constant or the degree of coverage, it is detected, how far the cleaning process has progressed.

8. The method of claim 6, wherein, based on the electrical conductivity, the dielectric constant or the degree of coverage, residues of the at least one medium remaining in the container after termination of the cleaning process are detected.

9. An apparatus for process monitoring in automation technology, including:
    a capacitive or conductive measuring probe; and
    an electronics unit configured to perform the following steps:
        ascertain whether the measuring probe is at least partially in contact with a medium in a container;
        register as a function of time at least an electrical conductivity of the medium, a dielectric constant of the medium and a degree of coverage of the measuring probe by the medium; and
        monitor at least one process running within the container based on the electrical conductivity, the dielectric constant and the degree of coverage as a function of time;
    wherein the presence of a predeterminable proportion of at least a first and a second medium in the container is monitored.

10. The apparatus of claim 9, further including an interface for transmission of the ascertained measured values of at least the electrical conductivity, the dielectric constant or the degree of coverage to an external unit.

11. The apparatus of claim 9, further comprising a display unit for display of at least the electrical conductivity, the dielectric constant or the degree of coverage as a function of time, or for display of information concerning the process running within the container.

12. A computer program product for execution by a computer, including:
    computer code for ascertaining whether the measuring probe is at least partially in contact with a medium in a container;
    computer code for registering as a function of time at least an electrical conductivity of the medium, a dielectric constant of the medium and a degree of coverage of the measuring probe by the medium; and
    computer code for monitoring at least one process running within the container based on the electrical conductivity, the dielectric constant and the degree of coverage as a function of time;
    wherein the presence of a predeterminable proportion of at least a first and a second medium in the container is monitored.

13. A non-transitory computer readable medium having stored thereon software instructions that, when executed by a processor, cause the processor to perform a method including the following steps:
    ascertain whether a measuring probe is at least partially in contact with a medium in a container;
    register as a function of time at least an electrical conductivity of the medium, a dielectric constant of the medium and a degree of coverage of the measuring probe by the medium; and
    monitor at least one process running within the container based on the electrical conductivity, the dielectric constant and the degree of coverage as a function of time;
    wherein the presence of a predeterminable proportion of at least a first and a second medium in the container is monitored.

* * * * *